(12) United States Patent
Darbinian et al.

(10) Patent No.: US 7,781,788 B2
(45) Date of Patent: Aug. 24, 2010

(54) LIGHT EMITTING DEVICE PACKAGE HAVING A TRANSPARENT COVER

(75) Inventors: Arthur Darbinian, Suwon-si (KR); Seung Tae Choi, Suwon-si (KR); Ki Hwan Kwon, Suwon-si (KR); Chang Youl Moon, Suwon-si (KR); Kyu Ho Shin, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 109 days.

(21) Appl. No.: 11/495,764

(22) Filed: Jul. 31, 2006

(65) Prior Publication Data

US 2007/0145393 A1    Jun. 28, 2007

(30) Foreign Application Priority Data

Dec. 27, 2005    (KR) .................. 10-2005-0130950

(51) Int. Cl.
*H01L 33/00*    (2010.01)
(52) U.S. Cl. ..................... 257/98; 257/99; 257/100; 257/E25.02

(58) Field of Classification Search ............... 257/98, 257/99, 100, E25.02
See application file for complete search history.

(56) References Cited

U.S. PATENT DOCUMENTS

| 6,531,328 | B1 | 3/2003 | Chen |
| 6,599,768 | B1 | 7/2003 | Chen |
| 6,614,103 | B1 | 9/2003 | Durocher et al. |
| 2005/0199884 | A1* | 9/2005 | Lee et al. ................. 257/79 |
| 2006/0261364 | A1* | 11/2006 | Suehiro et al. ............ 257/100 |

* cited by examiner

*Primary Examiner*—Lynne A Gurley
*Assistant Examiner*—Vernon P Webb
(74) *Attorney, Agent, or Firm*—Sughrue Mion, PLLC

(57) ABSTRACT

A light emitting device package including a transparent cover having an electrode pattern formed on a bottom surface thereof; a light emitting device installed below the transparent cover and electrically connected to an external circuit via the electrode pattern; a fixing resin which fixes the light emitting device onto the bottom surface of the transparent cover; and a metal slug provided under the fixing resin to dissipate heat away from the light emitting device.

18 Claims, 13 Drawing Sheets

LIGHT EMITTING DEVICE PACKAGE HAVING A TRANSPARENT COVER

CROSS-REFERENCE TO RELATED PATENT APPLICATIONS

This application claims the benefit of Korean Patent Application No. 10-2005-130950, filed on Dec. 27, 2005, in the Korean Intellectual Property Office, the disclosure of which is incorporated herein by reference.

BACKGROUND OF THE INVENTION

1. Field of the Invention

Apparatuses and methods consistent with the present invention relate to a light emitting device package that can be reduced in size and easily manufactured and a method of manufacturing the same.

2. Description of the Related Art

U.S. Pat. No. 6,599,768 discloses a "Surface Mounting Method for High Power Light Emitting Diode". A substrate, formed of a material which readily transfers heat and electricity, is provided to be equipped with a high brightness light emitting diode. A trench is formed on the substrate and is filled with an insulating material to partition the substrate into two or more parts. A reflecting frame, including a reflecting surface, is formed on the substrate, and a light emitting diode (LED) chip is disposed on the reflecting frame. After connecting a terminal of the LED chip to a terminal of the substrate, the reflecting frame is filled with epoxy or a transparent resin to seal the LED chip. This method is used for forming an LED on a substrate in which a trench is formed on the substrate and the trench is filled with an insulating material. In this conventional method of forming an LED, a complex structure is required for installing the LED chip, and the manufacturing process is also complicated.

Furthermore, an additional reflecting frame structure has to be formed for forming a reflecting surface on the periphery of the LED chip, and this may be an obstacle for reducing the size of the structure of the LED chip package. Particularly, in order to form an excellent reflecting surface, the reflecting surface must be coated with a material having a reflective property and must have a surface roughness of less than a half of a wavelength ($\lambda$) of light generated from an LED. For this, the surface has to be processed. Accordingly, it is very complicated and expensive to fabricate a conventional structure having a reflecting surface with a suitable surface roughness.

U.S. Pat. No. 6,531,328 discloses a "Packaging of Light-Emitting Diode". A silicone wafer is used as a substrate, as described in this reference. A recess for installing an LED chip and forming a reflecting surface is formed on the top of the wafer by wet etching, and a via hole is formed from the bottom surface of the wafer by dry etching. After forming an insulating layer and an electrode on a surface of the wafer, the LED chip is installed and covered with a transparent encapsulation resin.

As described above, many manufacturing processes have to be performed to form an LED chip package structure. These processes may be a factor in increasing the manufacturing cost. Also, though U.S. Pat. No. 6,531,328 has the merit of applying a conventional technology by using a silicone wafer, since the silicone wafer has a low heat conductibility, heat generated from the LED chip may not be dissipated easily. When heat can not be dissipated, a maximum amount of current applied to the LED chip may be limited, thereby limiting a brightness of the light generated by the LED chip.

Also, a typically used wire bonding technique, in which a metal wire is soldered to a terminal to bond the LED chip, may limit the packaging density of the resultant LED package.

SUMMARY OF THE INVENTION

An exemplary aspect of the present invention provides a light emitting device package capable of having a simple structure and being manufactured in a small size and a method of manufacturing the same.

An exemplary aspect of the present invention also provides a light emitting device package having the ability to emit light of a high quality without forming a via hole, trench, or a reflecting surface, and a method of manufacturing the same.

An exemplary aspect of the present invention also provides a light emitting device package capable of reducing an interval between light emitting devices by eliminating wire bonding and providing an excellent cooling effect and a method of manufacturing the same.

According to an exemplary aspect of the present invention, there is provided a light emitting device package including a transparent cover having an electrode pattern formed on a bottom surface thereof; a light emitting device installed below the transparent cover; a fixing resin for fixing the light emitting device onto the bottom surface of the transparent cover; and a metal slug provided under the fixing resin to dissipate heat away from the light emitting device.

The light emitting device package may be installed on a printed circuit board (PCB) or another substrate, and the transparent cover is located on a top of the light emitting device to protect the light emitting device and to enable a part or all of a light generated to pass therethrough. The transparent cover may comprise a transparent material for transmitting most of the light or a perfectly transparent material. The positions and number of the electrode patterns connected to the light emitting device may vary based on the positions and number of terminals of the light emitting device.

The electrode pattern is formed on the bottom surface of the transparent cover and may electrically connect the terminals of the light emitting device to terminals of an external circuit. The metal slug is installed below the light emitting device and the fixing resin and may transmit heat generated from the light emitting device to the substrate or to the surrounding air. Since the light emitting device is not connected to the circuit by using a conventional wire bonding, the size of the package may be reduced and the density of internal elements may be increased. Namely, since the package has a thickness as high as a height of the transparent cover and the metal slug, the package may have a height of less than approximately 2 mm. Since the package has a width as wide as a width of the light emitting device and a soldered area, the package may have a width of less than approximately 4 mm.

Also, adsorbing light may be reduced by using a transparent fixing resin such as an epoxy, and a brightness of the light from the light emitting device may be increased by using a luminescent material which serves as a wavelength conversion layer. Also, the light may be condensed by forming a light condensing lens unit rather than using a conventional reflecting surface. In addition, the transparent cover may have a phosphorescent or fluorescent property by mixing luminescent material into the transparent cover. The luminescent material has a phosphorescent or fluorescent property and, in the present invention, may have a function of converting an ultraviolet (UV) wavelength generated by the light emitting device into a white light wavelength.

According to another exemplary aspect of the present invention, there is provided a light emitting device package including a transparent cover having a plurality of electrode patterns formed on a bottom surface thereof; a light emitting device installed below the transparent cover and electrically connected to the plurality of the electrode patterns; a wavelength conversion layer interposed between the transparent cover and the light emitting device and formed of a luminescent material; a transparent epoxy resin for fixing the light emitting device onto the bottom surface of the transparent cover; a metal slug provided below the transparent epoxy resin; and at least one solder ball, formed on an end portion of the plurality of electrode patterns, which connects the light emitting device to an external circuit.

The light emitting device is installed on the bottom surface of the transparent cover via the transparent epoxy resin. At least two electrode patterns corresponding to the light emitting device are formed below the transparent cover. An inner end of the electrode pattern may be connected to terminals of the light emitting device by soldering, and a solder ball is formed on an outer end of each of the plurality of electrode patterns and may electrically connect the electrode patterns with an external circuit. The solder ball may fix the light emitting device package to a substrate as well as connect the electrode patterns to contacts of an external circuit.

Light generated from the light emitting device may be externally transmitted via the transparent cover. The light that is reflected at a boundary between the transparent cover and the transparent epoxy resin may be temporarily converted or stored in the wavelength conversion layer and may be transmitted externally via the transparent cover. To increase a density of elements forming the package, a recess may be formed on the bottom surface of the transparent cover and the light emitting device may be installed in the recess, thereby reducing a height of the package.

According to another exemplary aspect of the present invention, there is provided a light emitting device package including a transparent cover; a plurality of light emitting devices installed below the transparent cover; electrode patterns formed on a bottom surface of the transparent cover and electrically connecting terminals of the plurality of light emitting devices and external circuits to each other; a transparent epoxy resin for fixing the plurality of the light emitting devices to the bottom surface of the transparent cover; and a metal slug provided below the transparent epoxy resin. The plurality of light emitting devices may be installed below the transparent cover. Each of the electrode patterns connecting the light emitting device with the external circuit may correspond to a terminal of the light emitting device and a terminal of the external circuit, one to one. Some terminals of the light emitting device may be electrically connected to each other, and other terminals may be directly connected to the external circuit.

BRIEF DESCRIPTION OF THE DRAWINGS

The above and other exemplary aspects and advantages of the present invention will become apparent from the following detailed description of exemplary embodiments of the present invention, taken in conjunction with the accompanying drawings in which.

DETAILED DESCRIPTION OF EXEMPLARY EMBODIMENTS OF THE INVENTION

Reference will now be made in detail to the exemplary embodiments of the present invention, examples of which are illustrated in the accompanying drawings, wherein like reference numerals refer to the like elements throughout. The exemplary embodiments are described below to explain the present invention by referring to the figures.

Figure 1:
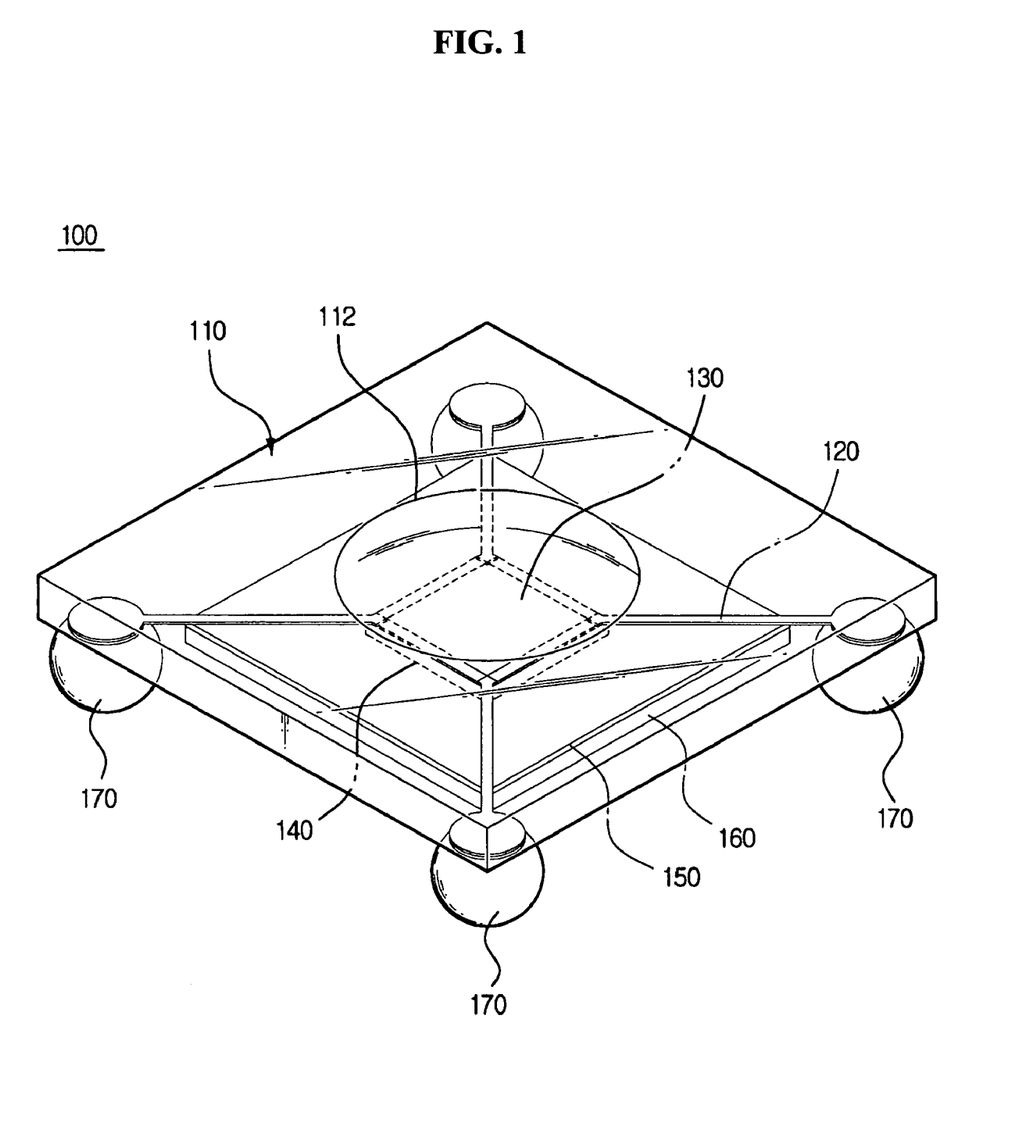
FIG. 1 is a perspective view of a light emitting device package according to an exemplary embodiment of the present invention.
Figure 2:
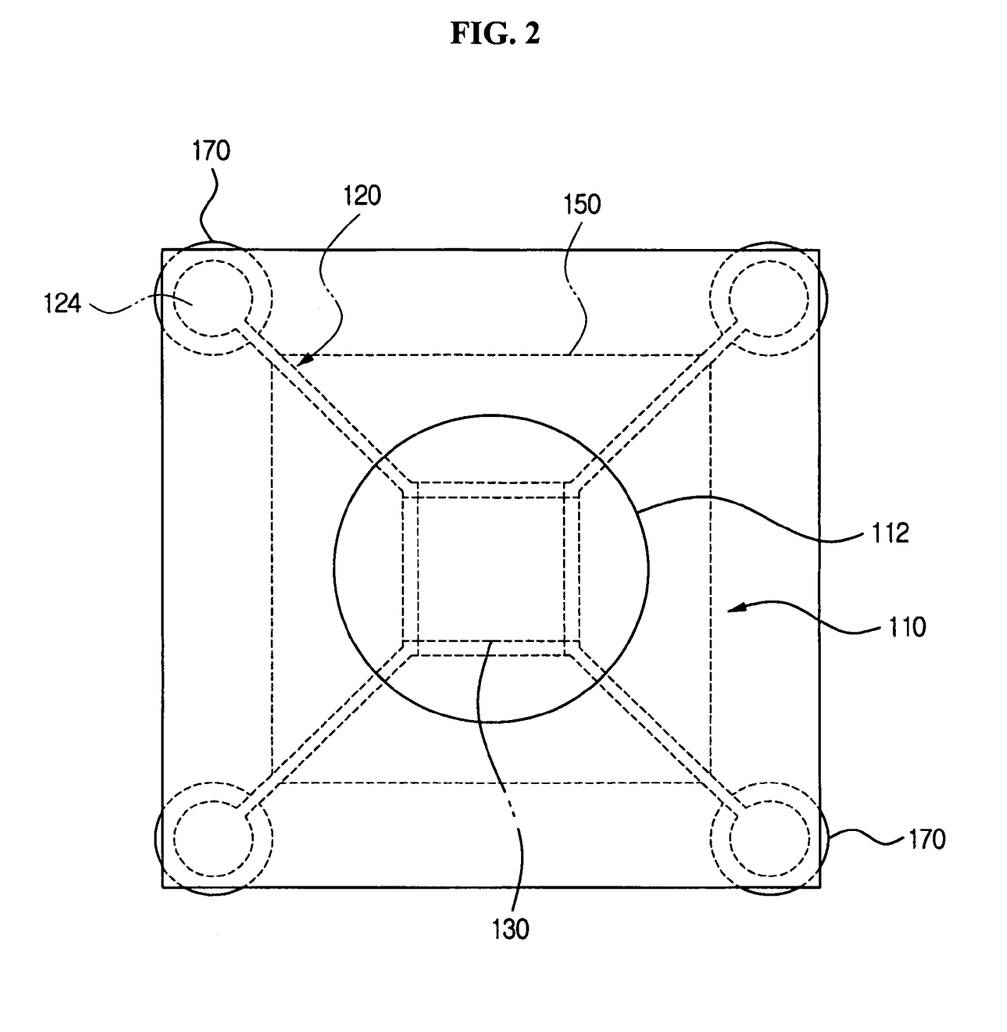
FIG. 2 is a top view of the light emitting device package of FIG. 1.
Figure 3:
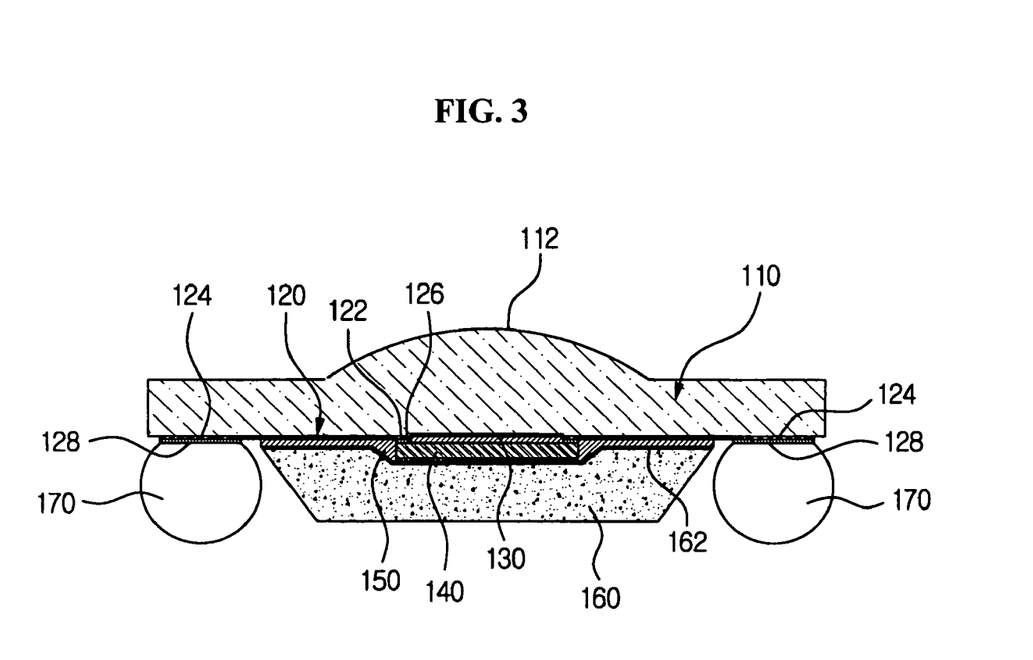
FIG. 3 is a cross-sectional view of the light emitting device package of FIG. 1.

FIG. 1 is a perspective view illustrating a light emitting device package according to an exemplary embodiment of the present invention, FIG. 2 is a top view illustrating the light emitting device package of FIG. 1, and FIG. 3 is a cross-sectional view illustrating the light emitting device package of FIG. 1.

Referring to FIGS. 1 through 3, a light emitting device package 100 according to the present exemplary embodiment includes a transparent cover 110, a wavelength conversion layer 130, a light emitting device 140, an epoxy resin 150, a metal slug 160, and solder balls 170. Below the transparent cover 110, the wavelength conversion layer 130 and the light emitting device 140 are sequentially provided. A periphery of the light emitting device 140 is filled with the epoxy resin 150, thereby fixing the light emitting device 140 to the transparent cover 110. Also, the metal slug 160 is provided below the epoxy resin 150, and the solder balls 170 are provided onto a bottom surface of the transparent cover 110, around the light emitting device 140.

The transparent cover 110 and the light emitting device 140 may be installed on a substrate by the solder balls 170. A light generated from the light emitting device 140 is transmitted externally via the transparent cover 110. Also, heat generated from the light emitting device 140 may be transmitted to the substrate via the metal slug 160. The wavelength conversion layer 130 may reduce a loss of the light to a minimum by temporarily converting or storing the light.

The transparent cover 110 is formed of transparent glass or transparent plastic and may be formed as a single body by using a sufficiently transparent material. The electrode patterns 120 are formed below the transparent cover 110. The electrode patterns 120 electrically connect terminals of the light emitting device with the solder balls 170 and may be formed in various numbers and various forms according to the specifics of the light emitting device 140, as would be understood by one of skill in the art. In the example illustrated in FIGS. 1 through 3, the light emitting device 140 has four terminals formed on a top surface thereof; therefore four electrode patterns 120 are formed on a bottom surface of the transparent cover 110. However, depending upon the type of light emitting device 140, the light emitting device may have two or three or more terminals, and the number and a position of the electrode patterns 120 formed on the bottom surface of the transparent cover 110 may vary depending upon the number of terminals of the light emitting device 140.

A lens unit 112 formed in the shape of a plano-convex lens is formed on the top surface of the transparent cover 110. Though, in this example, the lens unit 112 has a circular cross-section, the lens unit 112 may take any of a number of shapes according to a required optical property, as would be understood by one of skill in the art. The lens unit 112 may be formed in any of various forms capable of condensing. For example, the lens unit may be formed on the bottom surface of the transparent cover 110, and the lens unit may consist of a plurality of fine unevennesses formed on the surface of the transparent cover, thereby serving as a convex lens.

The wavelength conversion layer 130, formed of a luminescent material, is formed in a center of the bottom surface of the transparent cover 110, and the electrode patterns 120 are formed on a periphery of the wavelength conversion layer 130. The light emitting device 140 is disposed at a center of the electrode patterns 120, and the electrode patterns 120 may be physically and electrically connected to the terminals of the light emitting device 140 by soldering. After the light emitting device 140 is attached to the bottom of the transparent cover 110, the periphery of the light emitting device 140 is covered with the transparent epoxy resin 150. The transparent epoxy resin 150 fixes the light emitting device 140 to the transparent cover 110 and may be formed by molding or by another method as would be understood by one of skill in the art. Also, the epoxy resin 150 may electrically insulate the light emitting device 140 from the peripheral electrode patterns 120 and from the external circuit. In some cases, the epoxy resin may be colored and the light emitting device package may emit a light of a certain color according to the color of the epoxy resin.

The metal slug 160 is formed below the epoxy resin 150, and the metal slug 160 may be formed of copper or aluminum. As a method of forming the metal slug 160, a seed layer may be formed on the bottom surface of the epoxy resin 150 and electroplated to grow a metal layer. The metal slug 160 may maintain contact with a metal base layer disposed below the light emitting device package 100 and may transmit heat generated from the light emitting device to the metal base layer formed on the substrate. The metal slug 160 may be formed of various materials including, but not limited to, copper and aluminum. A width and thickness of the metal slug 160 may vary based on the use of the light emitting device 140.

A soldering contact 128 having a relatively wide area is formed on an outer end portion 124 of the electrode pattern 120 to attach the solder ball 170. In the soldering contact 128, an area for forming the solder ball 170 is defined by under bump metallization (UBM) processing. After the UBM processing, the solder ball 170 is formed on the end portion 124 of the electrode pattern 120.

Figure 4:
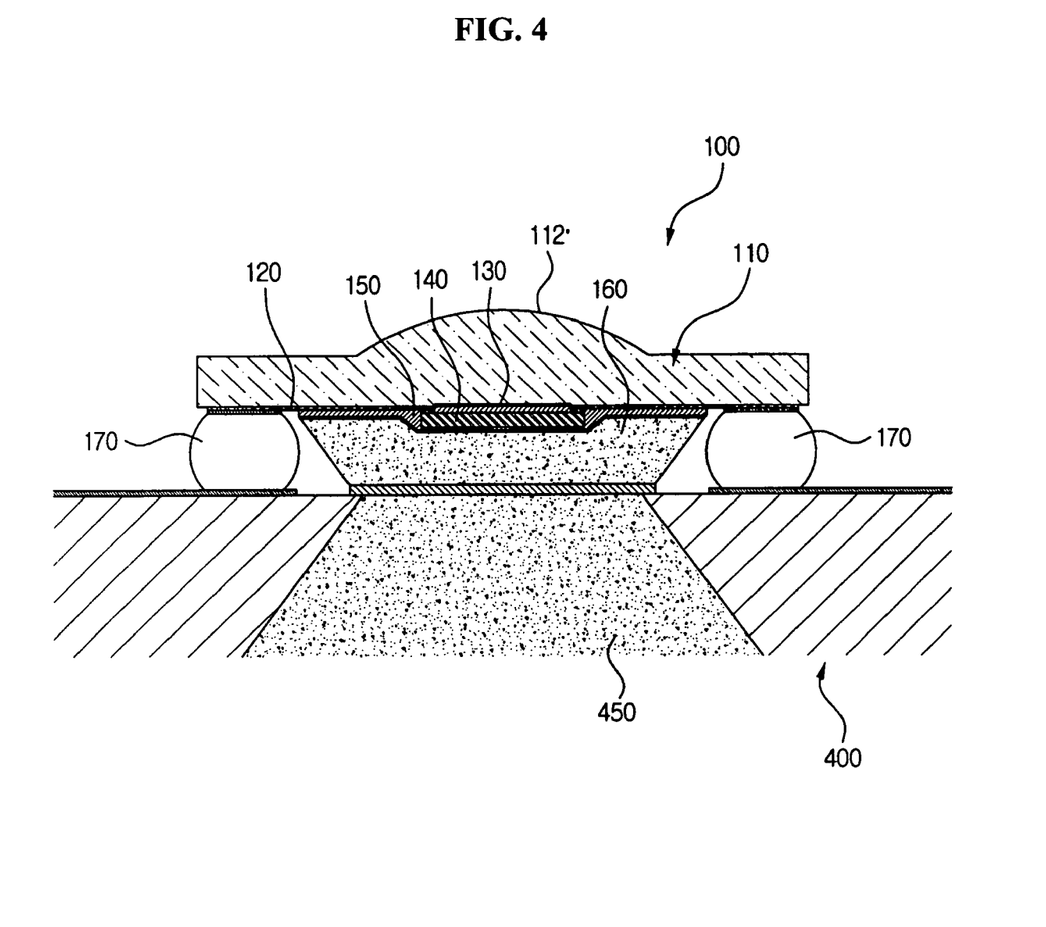
FIG. 4 is a cross-sectional view of an example of installing the light emitting device of FIG. 1.

FIG. 4 is a cross-sectional view illustrating an example of installing the light emitting device of FIG. 1.

Referring to FIG. 4, the light emitting device package 100 is disposed on the substrate 400 and attached to the substrate 400 by using the solder balls 170. The light emitting device 140 may be connected to an external circuit via the solder balls 170 and the electrode pattern 120 and may emit a bright light according to a control by the external circuit. The light emitting device 140 emits high heat energy. The metal slug 160 is formed below the light emitting device 140 and attached to a metal base layer 450 of the substrate 400, thereby effectively dissipating the heat. In this case, the substrate 400 to which the light emitting device package 100 is attached to is a metal core PCB (MCPCB). As shown in FIG. 4, the epoxy resin 150, the metal slug 160, and the metal base layer 450 of the substrate 400 may be connected to each other in the shape of a bottleneck. The light emitting device package 100 may be applied to a consumer product requiring high brightness.

Hereinafter, an exemplary method of manufacturing the light emitting device package 100 shown in FIGS. 1 through 3 will be described. FIGS. 5 through 10 are cross-sectional views illustrating an exemplary method of manufacturing the light emitting device package 100 of FIG. 1.

Figure 5:
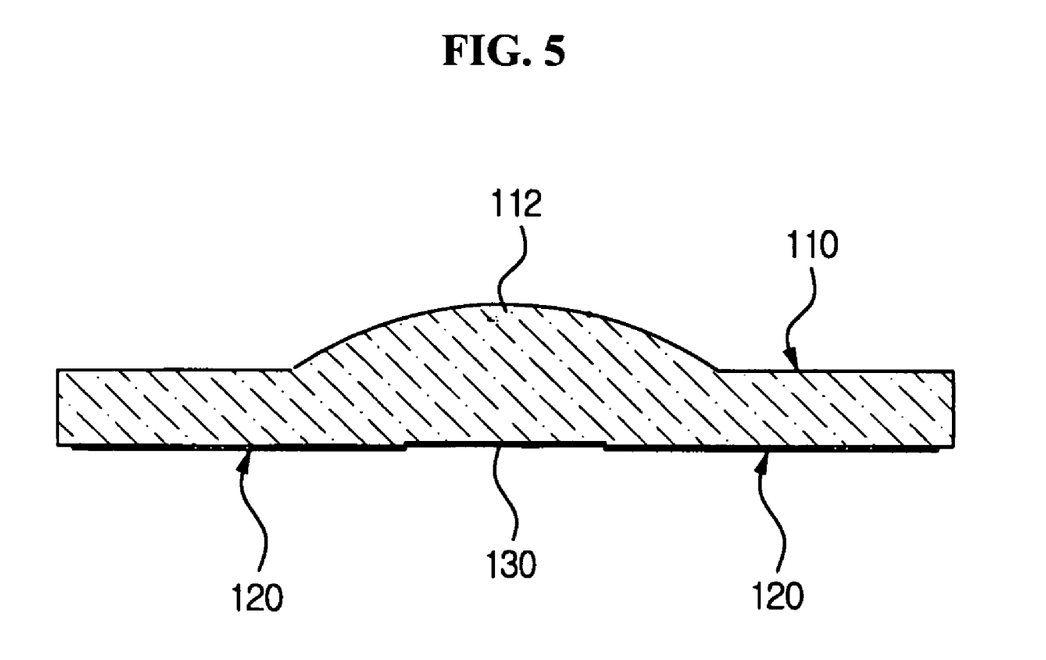
FIGS. 5 through 10 are cross-sectional views of an exemplary method of manufacturing the light emitting device package of FIG. 1.

Referring to FIG. 5, the wavelength conversion layer 130 and the electrode patterns 120 are formed on the bottom surface of the transparent cover 110 including the lens unit 112. The wavelength conversion layer 130 formed of a luminescent material may be formed on the bottom surface of the transparent cover 110 by deposition or by screen-painting. Also, the electrode pattern 120 may be formed of a conductive material and may be formed on the bottom surface of the transparent cover 110 by electroplating.

Figure 6:
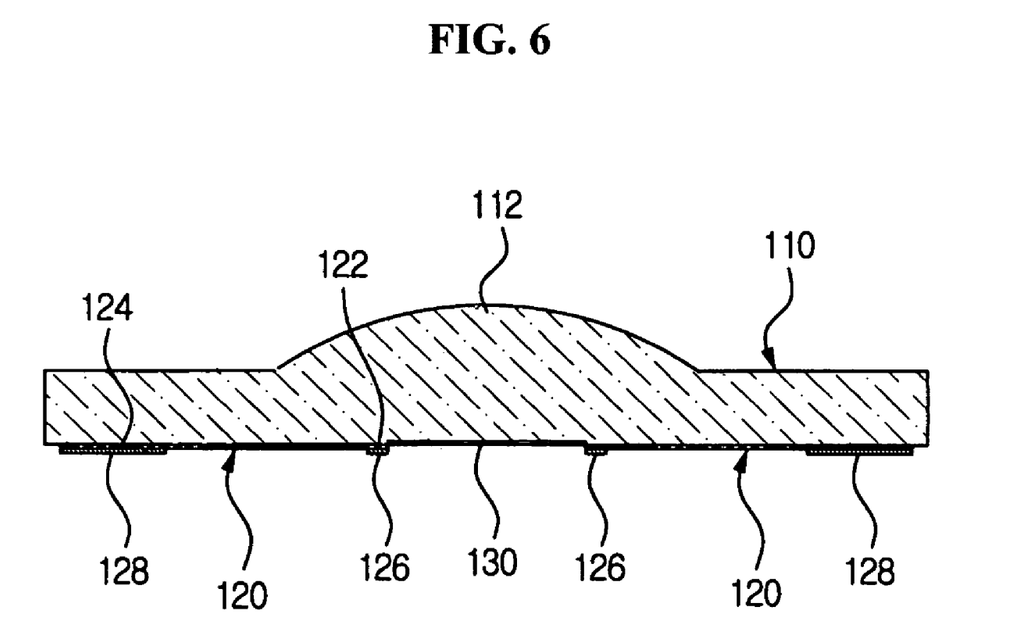

Referring to FIG. 6, UBM layers 126 and 128 are formed on inner end portions 122 of the electrode pattern 120, contacted with the terminal of the light emitting device 140, and on outer end portions 124 of the electrode pattern 120, contacted with the solder ball 170, respectively. The UBM layers 126 and 128 may be formed by E-beam evaporation or by sputtering.

Figure 7:
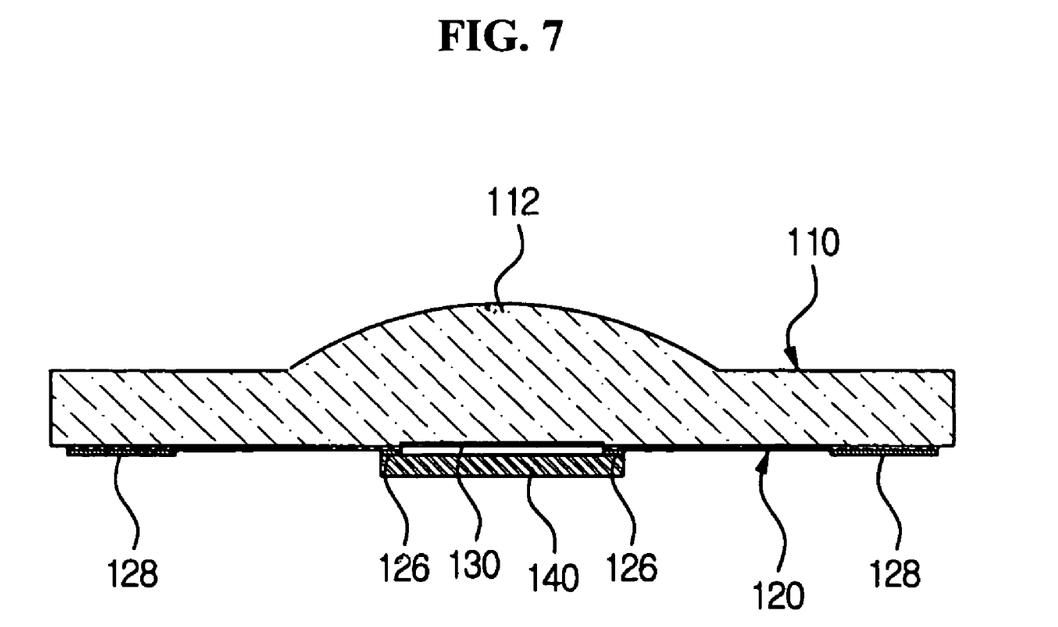

Referring to FIG. 7, after forming the contacted UBM layers 126 and 128, the terminal of the light emitting device 140 is disposed to correspond to the inner end portions 122 to install the light emitting device 140 below the transparent cover 110. The light emitting device 140 is mounted on the electrode patterns 120 via eutectic solder bonding and may be mounted at a relatively low temperature.

Figure 8:
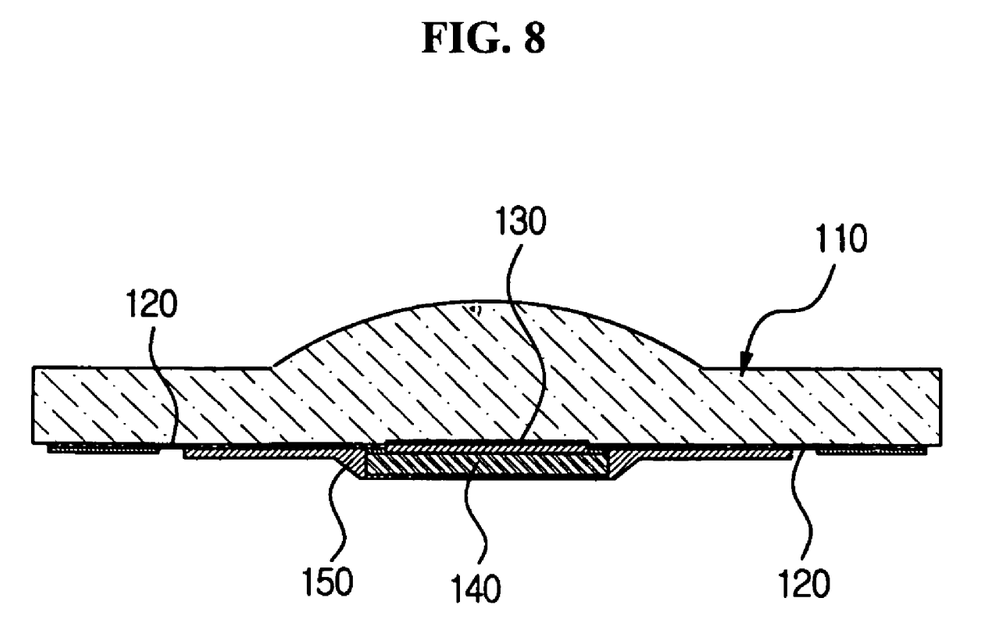

Referring to FIG. 8, an epoxy resin layer may be formed of an epoxy resin 150 having an excellent optical property. The epoxy resin 150 is formed around the periphery of the light emitting device 140 and may fix the light emitting device 140 to the transparent cover 110. Also, the epoxy resin 150 may be a type of an insulating material and may insulate the light emitting device 140 from peripheral materials excluding the electrode pattern 120 connected to the terminal of the light emitting device 140.

Figure 9:
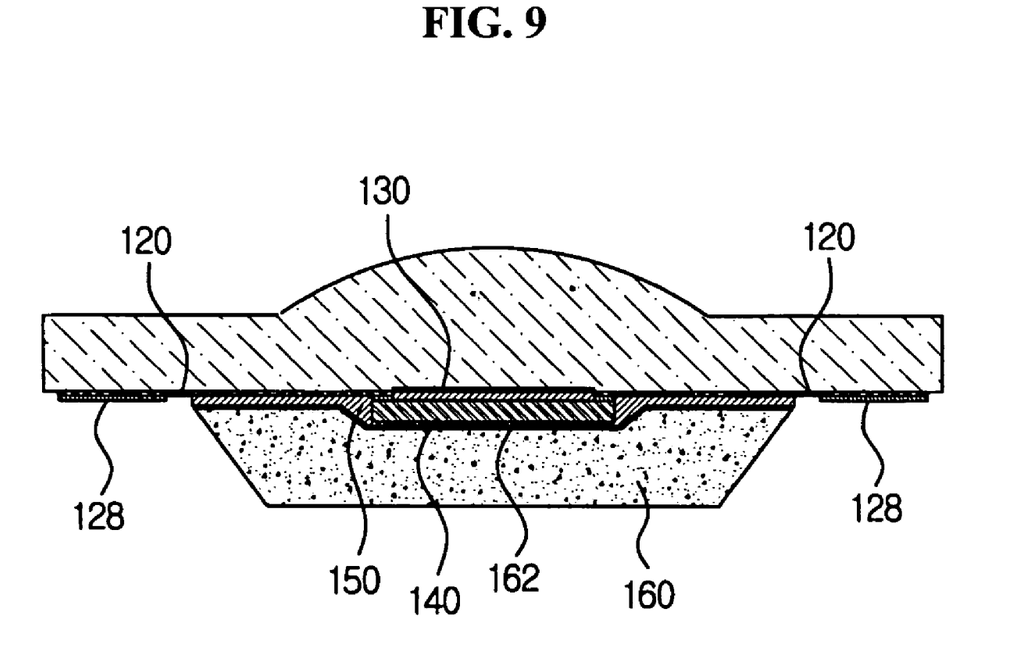

Referring to FIG. 9, after forming the epoxy resin 150, a seed layer 162 is formed on a bottom surface of the epoxy resin 150. The seed layer 162 may be used as a base layer for electroplating and may be formed of Cr/Au or Ti/Cu. To form the seed layer 162, a material for the seed layer 162 is coated on the bottom surface of the transparent cover 110 and the epoxy resin 150; a pattern is selectively formed from the material coating to remain on the bottom surface of the epoxy resin 150; and an exposed part of the material for forming the seed layer 162 is removed, thereby forming the seed layer 162. Copper or aluminum is grown on the seed layer 162 to form the metal slug 160.

Figure 10:
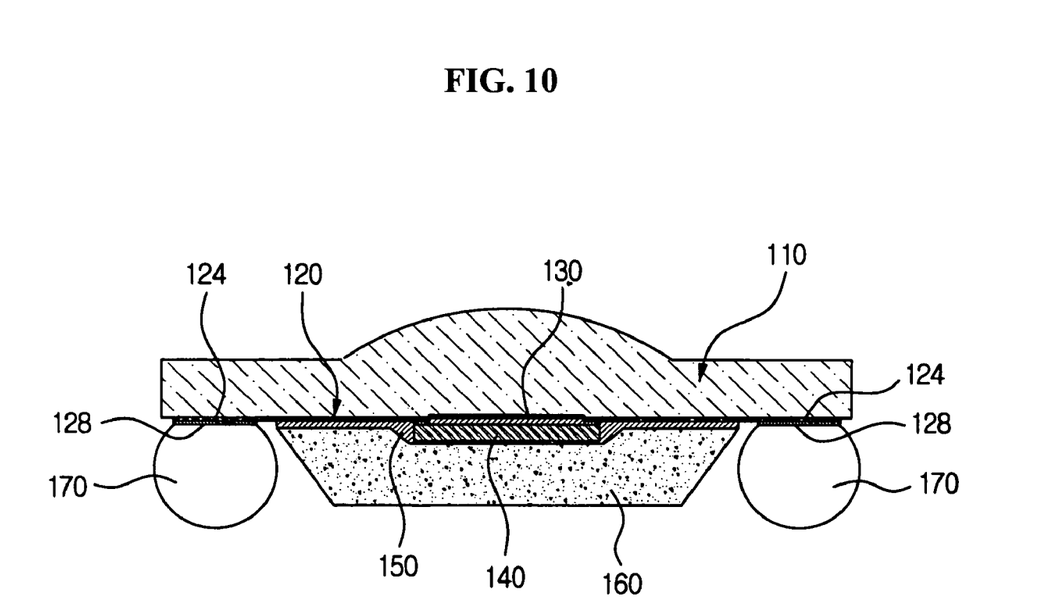

Referring to FIG. 10, the solder balls 170 may be formed on the outer end portions 124 of the electrode pattern 120, on which the UBM layers 128 are formed. The solder balls 170 are formed to having an approximate diameter of no less than a thickness of the metal slug 160 and may connect the light emitting device 140 to the external circuit via terminals of the substrate.

Figure 11:
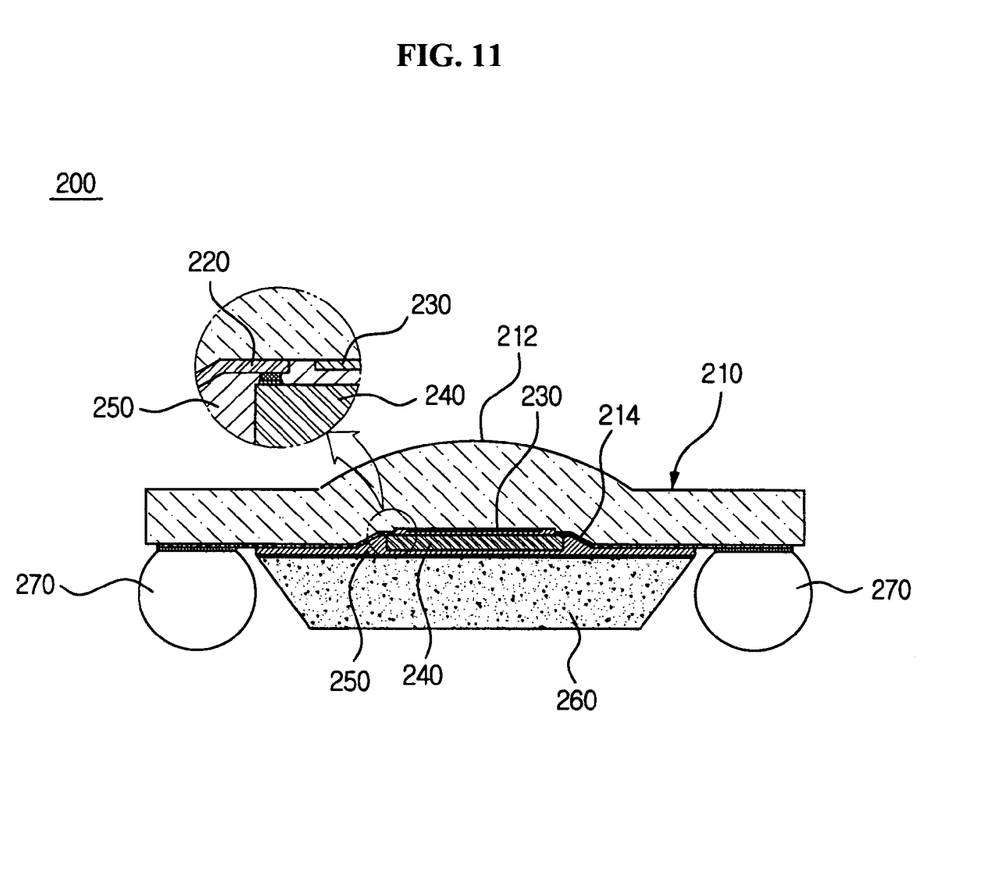
FIG. 11 is a cross-sectional view of a light emitting device package according to another exemplary embodiment of the present invention.

FIG. 11 is a cross-sectional view illustrating a light emitting device package 200 according to another exemplary embodiment of the present invention.

The light emitting device package 200 according to the present exemplary embodiment includes a transparent cover 210, a wavelength conversion layer 230, a light emitting device 240, an epoxy resin 250, a metal slug 260, and solder balls 270. A recess 214 is formed on a bottom surface of the transparent cover 210, and the wavelength conversion layer 230 and the light emitting device 240 are partially inserted into the recess 214. A total height of the light emitting device package 200 may be reduced by inserting the light emitting device 240 into the recess 214. The wavelength conversion layer 230 and the light emitting device 240 are sequentially provided in the recess 214. The light emitting device 240 is covered with the epoxy resin 250 to be fixed to the transparent cover 210. Also, the metal slug 260 is provided below the epoxy resin 250, and the solder balls are attached to the bottom surface of the transparent cover 210, around the light emitting device 240.

As in the previous exemplary embodiment described above, the transparent cover 210 and the light emitting device 240 may be installed on a substrate. However, in some cases, a transparent cover and a light emitting device may be installed on a substrate by various other methods such as by supersonic wave bonding. In this case, four edges of the transparent cover may be extended to be contacted with the substrate and an oscillation generated from a horn for generating an ultrasonic wave may be transmitted to a contact through the transparent cover.

Light generated from the light emitting device 240 is transmitted externally via the transparent cover 210. Also, heat generated from the light emitting device 240 may be transmitted to the substrate via the metal slug 260, and the wavelength conversion layer 230 may reduce a loss of light to a minimum by temporarily converting or storing the light.

The transparent cover 210 is formed of transparent glass or plastic and may be formed as a single body by using a sufficiently transparent material. An electrode pattern 220 is formed on the bottom surface of the transparent cover 210. The electrode pattern 220 electrically connects terminals of the light emitting device 240 to the solder balls 270. A lens unit 212 formed in the shape of a plano-convex lens is formed on the top surface of the transparent cover 210.

The wavelength conversion layer 230, formed of a luminescent material, is formed in a center of the bottom surface of the transparent cover 210, and the electrode pattern 220 is formed on a periphery of the wavelength conversion layer 230. The light emitting device 240 is disposed at a center of the electrode pattern 220, and the electrode pattern 220 may be physically and electrically connected to the terminals of the light emitting device 240 by soldering.

After attaching the light emitting device 240 to the bottom surface of the transparent cover 210, a periphery of the light emitting device may be covered with the transparent epoxy resin 250. The metal slug 260 is formed on the bottom surface of the epoxy resin 250. The metal slug 260 may be formed of copper or aluminum via electroplating. The solder balls 270 are attached to outer end portions of the electrode pattern 220.

Figure 12:
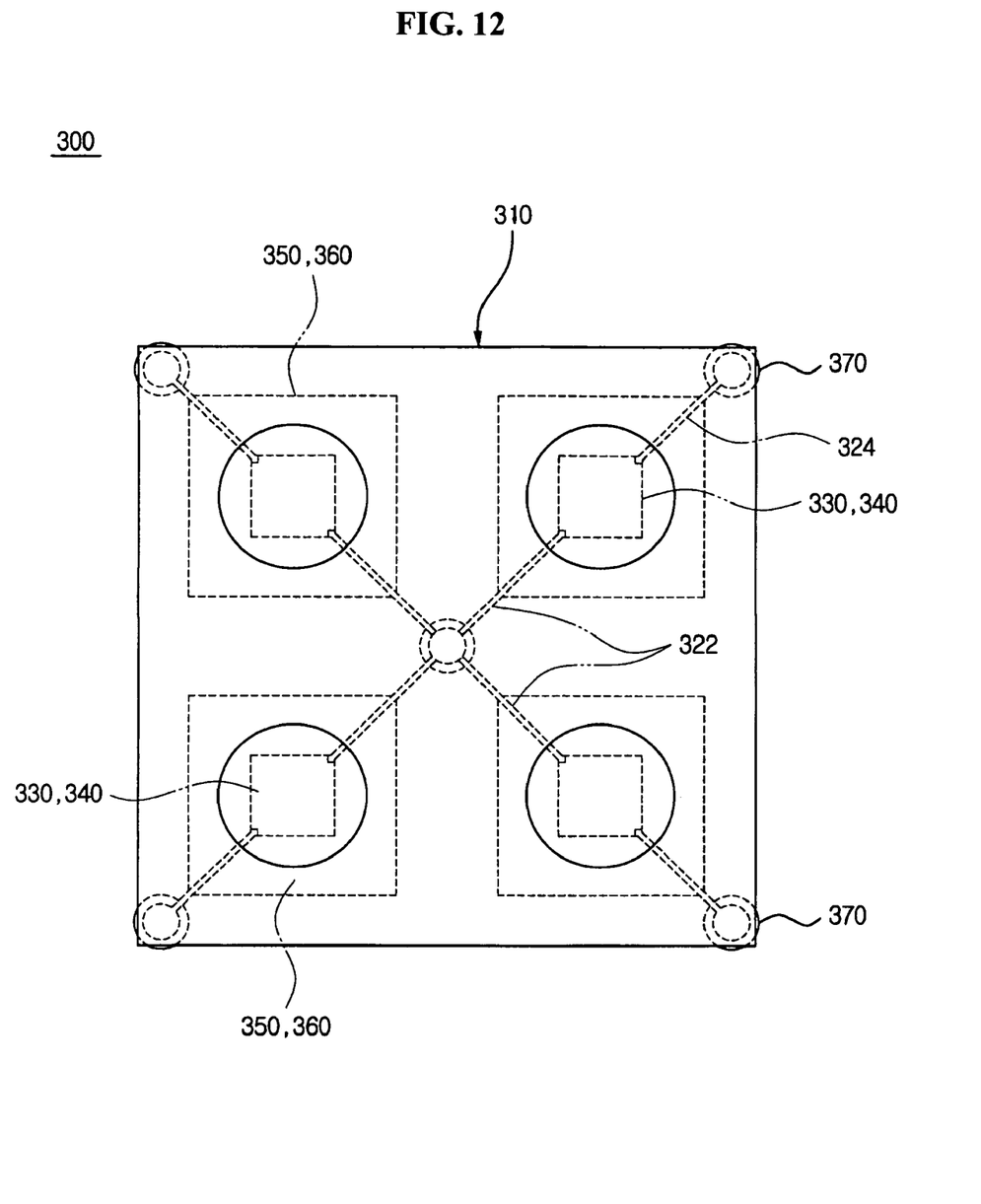
FIG. 12 is a top view of a light emitting device package according to another exemplary embodiment of the present invention.
Figure 13:
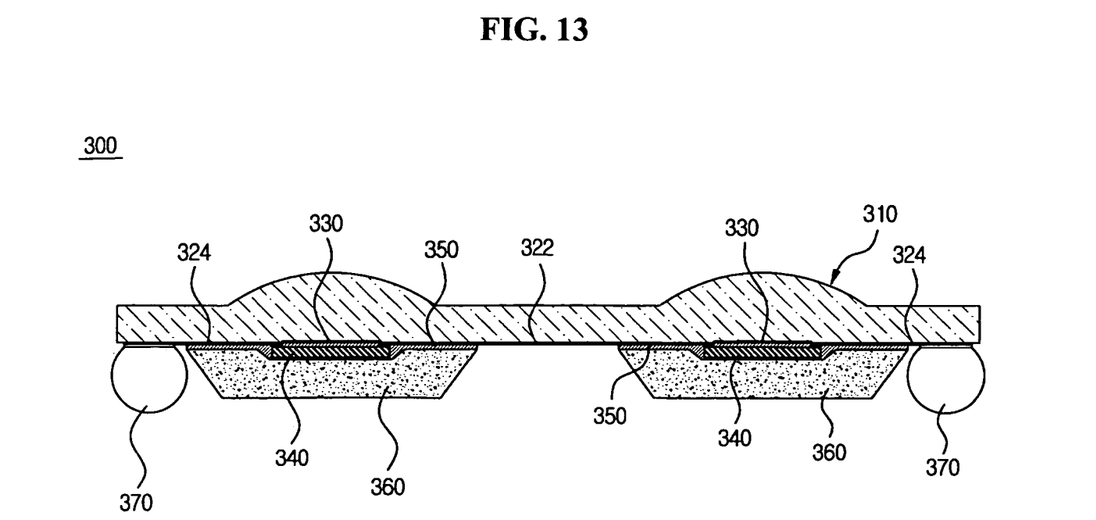
FIG. 13 is a cross-sectional view of the light emitting device package of FIG. 12.

FIG. 12 is a top view illustrating a light emitting device package 300 according to another exemplary embodiment of the present invention, and FIG. 13 is a cross-sectional view illustrating the light emitting device package 300 of FIG. 12.

Referring to FIGS. 12 and 13, a light emitting device package 300 according to the present embodiment includes a transparent cover 310, four light emitting devices 340, four wavelength conversion layers 330, epoxy resin 350, and metal slugs 360. Each of the wavelength conversion layers corresponds to one of the light emitting devices 340. The four light emitting devices 340 are connected to each other by an internal electrode pattern 322 formed internally, and external electrode patterns 324 are connected to outer end portions of the light emitting devices 340. A solder ball 370 is formed on an end portion of each external electrode pattern 324.

The four wavelength conversion layers 330 and the four light emitting devices 340 form a 2×2 array and are sequentially provided on a bottom surface of the transparent cover 310. The light emitting devices 340 are covered with epoxy resin 350, thereby fixing the light emitting devices 340 to the transparent cover 310 and insulating each light emitting device 340 from other peripheral light emitting devices. Also, the metal slug 360 is provided below the epoxy resin 350. Solder balls are attached to the bottom of the transparent cover 310 around the light emitting devices 340. The transparent cover 310 and the light emitting devices 340 may be installed on a substrate by using the solder balls 370. In this case, the solder balls 370 may bond the package to terminals of the substrate by eutectic solder bonding.

Light generated from the light emitting devices 340 is transmitted externally via the transparent cover 310. Also, heat generated from the light emitting devices 340 may be transmitted to the substrate via the metal slug 360. The wavelength conversion layer 330 disposed on each of the light emitting devices 340 may reduce a loss of light to a minimum by temporarily storing the light.

As shown in FIGS. 12 and 13, a plurality of the light emitting devices 340 may be installed below a single transparent cover 310. Terminals of the light emitting device 340 may be directly connected to the terminals of the substrate by the solder balls 370. However, in some cases, the terminals of the light emitting devices 340 may be connected to each other to be indirectly connected to the terminals of the substrate. As described above, a plurality of light emitting devices may be installed on a single transparent cover, thereby increasing an installation interval and a density of the light emitting devices and maintaining a small number of terminals within a simple structure connected to a substrate.

A light emitting device package according to an exemplary aspect of the present invention may be applied to a mobile phone or another miniaturized portable electronic product, due to a simple structure and small size thereof.

Also, a safe electrode structure may be formed without forming a via hole or a trench, which are made by a complex process, and a condensing function may be performed by using a wavelength conversion layer or a lens unit without forming a reflecting surface around a light emitting device. Accordingly, an ability to emit light of high brightness may be realized and defect rates may be reduced, and a density between light emitting devices may be increased.

Also, an interval between light emitting devices may be reduced by eliminating conventional wire bonding, and an excellent cooling effect may be provided by using a metal slug.

Also, a plurality of light emitting devices may be installed below a single transparent cover, thereby decreasing an installation interval and increasing a density of light emitting devices. In addition, a number of terminals connected to a substrate may be reduced to easily manufacture the substrate.

Although a few exemplary embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:
1. A light emitting device package, comprising:
   a transparent cover;

an electrode pattern formed on a periphery of a wavelength conversion layer, wherein the wavelength conversion layer is formed in a center of a bottom surface of the transparent cover;

a light emitting device disposed below the transparent cover and electrically connected to the electrode pattern;

a fixing resin fixing the light emitting device to the transparent cover;

a metal slug, disposed below the fixing resin, which dissipates heat away from the light emitting device; and a solder ball electrically connected to the electrode pattern;

wherein under bump metallization (UBM) layers form a soldering contact on an inner end portion of the electrode pattern contacted with the light emitting device and on an outer end portion of the electrode pattern contacted with the solder ball, and the soldering contact formed on the outer end portion of the electrode pattern having a wide area to attach to the solder ball.

2. The package of claim 1, wherein the transparent cover comprises a plano-convex lens unit disposed above the light emitting device.

3. The package of claim 1, wherein the electrode pattern comprises a plurality of electrode patterns electrically separated from each other and formed on the bottom surface of the transparent cover; and the solder ball is provided at an end of each of the plurality of electrode patterns.

4. The package of claim 1, wherein the fixing resin comprises a light-transmissive material.

5. The package of claim 4, wherein the fixing resin is colored.

6. The package of claim 1, wherein the transparent cover comprises a luminescent material.

7. The package of claim 1, wherein the transparent cover comprises a recess on the bottom surface thereof, and wherein the light emitting device is disposed in the recess.

8. The package of claim 1, further comprising a seed layer between the fixing resin and the metal slug;

wherein the metal slug is formed on the seed layer by electroplating.

9. A light emitting device package, comprising:

a transparent cover;

a plurality of electrode patterns disposed on a bottom surface of the transparent cover;

a light emitting device disposed below the transparent cover and electrically connected to the plurality of electrode patterns;

a wavelength conversion layer, comprising a luminescent material, disposed between the transparent cover and the light emitting device and formed on a periphery of the electrode patterns;

a transparent epoxy resin which fixes the light emitting device onto the bottom surface of the transparent cover;

a metal slug disposed below the transparent epoxy resin; and a solder ball formed on an end portion of each of the plurality of electrode patterns;

wherein UBM layers are formed on inner end portions of the electrode patterns contacted with the light emitting device and on outer end portions of the electrode patterns contacted with the solder ball.

10. The package of claim 9, wherein the transparent cover comprises a plano-convex lens unit disposed above the light emitting device.

11. The package of claim 9, wherein the transparent epoxy resin is colored.

12. The package of claim 9, wherein the transparent cover comprises a recess in the bottom surface thereof and wherein the light emitting device is disposed in the recess.

13. A package for a light emitting device, the package comprising:

a transparent cover;

a plurality of light emitting devices disposed below the transparent cover;

electrode patterns formed on a bottom surface of the transparent cover and electrically connecting terminals of the plurality of light emitting devices and external circuits to each other;

a transparent epoxy resin which fixes the plurality of the light emitting devices to the bottom surface of the transparent cover, respectively;

a metal slug disposed below the transparent epoxy resin; and a wavelength conversion layer formed on a periphery of the electrode patterns;

wherein a recess is formed on a bottom surface of the transparent cover, and the wavelength conversion layer and the light emitting device are partially inserted into the recess.

14. The package of claim 13, wherein the transparent cover comprises a plano-convex lens unit disposed above the plurality of the light emitting devices.

15. The package of claim 13, wherein the wavelength conversion layer comprises a luminescent material disposed between the transparent cover and the plurality of the light emitting devices.

16. The package of claim 13, wherein the transparent cover comprises a plurality of recesses in the bottom surface thereof; and wherein each of the plurality of light emitting devices is disposed in one of the plurality of recesses.

17. The package of claim 13, further comprising a solder ball disposed on a soldering contact having a wide area and formed on an end portion of each of the second plurality of electrode patterns.

18. A light emitting device package, comprising:

a transparent cover;

a plurality of light emitting devices disposed below the transparent cover;

a first plurality of electrode patterns, formed on a bottom surface of the transparent cover, which electrically connect terminals of the plurality of light emitting devices to each other;

a second plurality of electrode patterns, formed on the bottom surface of the transparent cover, which are electrically connected to terminals of the plurality of light emitting devices;

a transparent epoxy resin which fixes the plurality of the light emitting devices to the bottom surface of the transparent cover;

a metal slug disposed below the transparent epoxy resin; and a wavelength conversion layer, comprising a luminescent material, disposed between the transparent cover and the light emitting device, and formed on a periphery of at least one of the first and second plurality of electrode patterns and which reduces a loss of a light to a minimum by temporarily converting or storing the light;

wherein a recess is formed on a bottom surface of the transparent cover, and the wavelength conversion layer and the light emitting device are partially inserted into the recess.

* * * * *